United States Patent [19]

Borriello et al.

[11] Patent Number: 4,513,427
[45] Date of Patent: Apr. 23, 1985

[54] DATA AND CLOCK RECOVERY SYSTEM FOR DATA COMMUNICATION CONTROLLER

[75] Inventors: Gaetano Borriello; Richard F. Lyon; Alan G. Bell, all of Palo Alto, Calif.

[73] Assignee: Xerox Corporation, Stamford, Conn.

[21] Appl. No.: 412,637

[22] Filed: Aug. 30, 1982

[51] Int. Cl.³ .............................................. H04L 7/06
[52] U.S. Cl. ...................................... 375/110; 375/87; 370/108
[58] Field of Search .................. 375/87, 110; 360/39–44, 51; 340/347 DD; 329/50, 104, 122; 328/56; 370/108

[56] References Cited

U.S. PATENT DOCUMENTS

| | | | |
|---|---|---|---|
| 3,953,674 | 4/1976 | Fletcher et al. | 375/87 |
| 3,996,481 | 12/1976 | Chu et al. | 307/262 |
| 4,011,402 | 3/1977 | Koike et al. | 358/213 |
| 4,063,220 | 12/1977 | Metcalfe et al. | 370/85 |
| 4,103,251 | 7/1978 | Glick | 331/1 A |
| 4,185,273 | 1/1980 | Gowan | 340/347 DD |
| 4,282,512 | 8/1981 | Boggs et al. | 340/147.037 |
| 4,287,596 | 9/1981 | Chari | 375/49 |
| 4,344,041 | 8/1982 | Maine | 329/50 |
| 4,358,741 | 11/1982 | Nardin | 331/2 |
| 4,363,002 | 12/1982 | Fuller | 331/1 A |
| 4,388,537 | 6/1983 | Kanuma | 307/297 |

OTHER PUBLICATIONS

Mead & Conway, Introduction to VLSI Systems, Addison-Wesley Pub. Co., pp. 17–18, 67, 229–236 (1980).

Primary Examiner—Benedict V. Safourek
Assistant Examiner—Stephen Chin
Attorney, Agent, or Firm—W. Douglas Carothers, Jr.

[57] ABSTRACT

A data and clock recovery system is provided in the signal handling receiver (SHRx) stage of an integrated MOS circuit data communication controller to provide accurate sampling of an incoming data packet for recovery of the data and data clock, regardless of differences in the electrical and environmentally affected characteristics of the circuit elements comprising the integrated MOS/VLSI semiconductor chip. The system comprises a delay means including a plurality of delay stages to generate a transition pulse for every transition in the data packet, a similar delay means to apply a predetermined amount of unit delay to all of the transition pulses, both data transition pulses and between bit transition pulses, means to develop a mask from the delayed transition pulses representative of the time occurrence of any between bit transitions, means to apply the mask to the incoming data packet whereby the extraneous between bit transition pulses are removed therefrom, and means coupled to the delay means to calibrate the delay means by ensuring that each of its delay stages continuously impose a predetermined unit delay per stage.

8 Claims, 16 Drawing Figures

DATA AND CLOCK RECOVERY SYSTEM FOR DATA COMMUNICATION CONTROLLER

TECHNICAL FIELD

This invention relates to a data and clock recovery system in a controller for use in a data communication system and more particularly to an integrated data communication controller having a self-calibrated and integrated data and clock recovery system for continuous accurate recovery of encoded data transmitted over a communication network and a method of obtaining precise timing in integrated circuitry to interpret a selected encoding scheme.

RELATED APPLICATION

U.S. Application Ser. No. 412,490, filed Aug. 30, 1982 and entitled SELF-CALIBRATED CLOCK AND TIMING SIGNAL GENERATOR FOR MOS/VLSI CIRCUITRY and assigned to the assignee herein.

BACKGROUND OF THE INVENTION

A local area computer network comprises a relatively small data communication system, usually within the confines of several thousand meters, for example, for the interconnection of a plurality of terminal or user devices or hosts, e.g., workstations. The protocol scheme, operational bandwidth and specifications of the network are such that high speed communication among such devices is possible. An overall methodology is to provide hosts, each capable of performing a plurality of computer aided functions independent of any other host coupled to the network, with means to access the network toward the overall goal of inter-cooperative data communication and improved efficiency in the use of time in conducting business.

A local area computer network generally takes the form of one of three basic topologies, a star, ring or bus. Each such network comprises several basic components. These components include a transmission medium, two or more stations or hosts and an interface to couple the hosts to the medium. The host makes direct communicative use of the communication channel and is generally a smart terminal. Specialized I/O devices, such as magnetic tape and disk drives, may include sufficient computing resources to function as "hosts" on a network. The transmission medium may be radio, coaxial cable, twisted wire pair or optical fiber. Repeaters may be used along the medium to extend the length of the transmission system beyond the physical constraints imposed by the medium.

The interface includes two basic components, a communication manager, e.g., a controller, and, in most cases, a transceiver. The controller for a host is the set of functions and algorithmic implementation necessary to manage host access to the medium. The basic functions include signal and data handling and transmission management, e.g., signalling conventions, encoding and decoding, serial-to-parallel conversion and vice versa, address recognition, error detection, buffering and packetization. These functions can be grouped into two logically independent sections of the controller: the transmitter section and the receiver section.

The transceiver contains the electronics to transmit and receive signals to and from the communication medium. A transceiver recognizes the presence of a signal when another host transmits and recognizes a collision that takes place when two or more hosts transmit simultaneously.

An example of a bus oriented local area network is called "Ethernet" and is basically disclosed in U.S. Pat. Nos. 4,063,220 and 4,282,512, assigned to the assignee herein, and is also discussed in the publication "The Ethernet Local Network: Three Reports" published by Xerox Corporation, February, 1980 and in the Ethernet Specifications published Sept. 30, 1980 by Digital Equipment Corporation, Intel Corporation and Xerox Corporation. Ethernet transmission of data signals is by means of packetized data bursts. Each packet contains the identification of the source and destination of that packet, along with a data field generally containing multiple digital data items. Packets are transmitted, for example, along a 50Ω coaxial cable at 10 Mbits/sec.

Access to the cable is by contention, using a carrier-sense multiple-access with collision-detection (CSMA/CD) technique. A characteristic of this technique, as in all packet transmission networks, is that access time to the network depends on traffic load. In a CSMA/CD system, stations contend for use of the common broadcast communications channel until one of them acquires access and then uses the cable to transmit a packet. Access is obtained by listening for activity on the cable, termed as "carrier sense". If carrier sense is true, transmission is deferred until the channel is quiet, i.e., no other carriers are present. When the channel is quiet, the workstation desiring access can proceed with transmission.

During transmission, the station listens for a collision due to any other carrier that may be on the channel. Since other stations will defer once they see a carrier, the first round-trip propagation time is the only time that such collisions can occur in the network. If no other carrier is sensed or detected within one-round trip time, the station is said to have acquired the channel. If another carrier is sensed in this time frame, the transmission of the packet is aborted and a jam signal is transmitted to ensure that the collision is also detected by all other stations connected to the channel. After jamming, each station waits a random length of time via a back off algorithm and tries again for access to the communication channel. Further details concerning the operation and specifications of this type of system are found in the previously mentioned publications.

With the development of integrated circuitry and, in particular, MOS/VLSI technology, e.g., nMOS, there is a standing desire to provide one or more of the basic components of a local area computer network in the form of an integrated semiconductor chip. This need is important for the interface or controller because if the size, and correspondingly the cost, of the controller can be reduced, availability of its use in many different types of smart terminal devices providing therein each with their own communication capability with other smart terminals. For example, it would be desirable to provide network communication and access by standard "smart" word processors. However, the cost of the presently available controllers is prohibitive for such applications. If a controller is fabricated as a MOS/VLSI semiconductor chip, a hugh reduction in cost can be realized permitting feasible commercial use of such a chip in any low cost standard processor for which communication of data over a network is desired.

Prior art data and clock recovery systems employ discrete circuit components that change in value over time continually requiring adjustment. This can be quite costly in technical maintenance when equipment is in the field. An example of such a recovery system is the phase or data/clock recovery circuit 332 disclosed in FIG. 6 of U.S. Pat. No. 4,063,220. Beside comprising a plurality of independent discrete devices, the propagation delay rate provided by the transition detector 700, which is a time delay circuit, is not continually the same due to changes, for example, in the operation of the one shot multivibrator 703. As a result, upon recovery of data from the data packet on line "i" to the data recovery device 704, the point of sampling may not be continually correct.

U.S. Pat. No. 4,287,596 also discloses a data and clock recovery system for the data processing system shown in FIG. 1. The system, like that of U.S. Pat. No. 4,063,220, includes a time delay circuit for the signal which provides the timing for subsequent data and clock recovery. Again, dependence is had on discrete components and circuit devices that cannot be continually relied upon to provide a continually precise delayed signal.

A more recent version of a data and clock recovery has been a phase lock loop (PLL) circuit employed in local area network workstations. This circuit suffers from the same problem as the multivibrator version in that each of the versions lack any continually guaranteed degree of signal delay accuracy due to the variable properties of discrete electrical components, in particular, capacitors in the circuits providing an RC time constant which must be periodically adjusted.

What is desired is some means of eliminating the use of these discrete components by MOS/VLSI implementation and also providing some guarantee of self-calibration to ensure continually accurate signal delay.

While MOS/VLSI implementation of the circuitry for a controller is very desirable, problems are encountered in employing MOS technology because minute changes in parameters that occur during fabrication. Die from one wafer to the next during successive wafer processing may readily have different transistor electrical properties. Uniformity in said properties are very important and crucial in electrical circuitry where clock synchronization and timing, for example, must be fairly precise in order to meet protocol specifications of the network and accurate decoding of received data.

An example of the precise timing necessary in controller circuitry is the encoding and decoding employed in the Ethernet local area computer network. The channel encoding employed is Manchester phase encoding with a data rate of 10 Mbits/sec with each bit cell 100 ns long. During the first half of each bit cell time (e.g., 0–50 ns) the serial data signal transmitted is the logical complement of the bit value being encoded during that cell. During the second half of the bit cell time (e.g. 50–100 ns), the uncomplemented value of the bit being encoded is transmitted. Thus, there is always a data signal transition either positive-going or negative-going in the center of each bit cell. During decoding, it is necessary to separate the incoming phase encoded bit stream into a data stream and a clock signal. If timing on the chip is not accurate so that the moment of signal sampling for data recovery is at the time of the data signal transition for each data cell, the data will be lost or not accurately decoded.

What is needed is some manner of implementation of the controller in MOS/VLSI technology while easily replicating integrated circuit characteristics in a uniform behavior in timing and the decoding of received data signals or packets in a data communication controller.

SUMMARY OF THE INVENTION

According to this invention, a data and clock recovery system is provided in the signal handling receiver (SHRx) stage of an integrated MOS circuit data communication controller to provide accurate sampling of the incoming data for recovery of the data and data clock regardless of differences in the electrical and environmentally affected characteristics of the circuit elements comprising the integrated MOS/VLSI semiconductor chip.

The data and clock recovery system provides for recovery phase encoded data from a data packet received by a data communication controller, the data packet including a plurality of data bit cells with one portion of each bit cell representing a logical complement of the bit value encoded and the other portion of each bit cell representing the bit value encoded whereby some transitions in a stream of the data bit cells represent one of two bit values while others represent between bit transitions. The system comprises a delay means including a plurality of delay stages to generate a transition pulse for every transition in the data packet, a similar delay means to apply a predetermined amount of unit delay to all of the transition pulses, both data transition pulses and between bit transition pulses, means to develop a mask from the delayed transition pulses representative of the time occurrence of any between bit transitions, means to apply the mask to the incoming data packet whereby the extraneous between bit transition pulses are removed therefrom, and means coupled to the delay means to calibrate the delay means by ensuring that each of its delay stages continuously impose a predetermined unit delay per stage.

The preferred embodiment of the integrated circuit for the system takes the form of a self-calibrated delay line utilizing a voltage control oscillator (VCO). The oscillator's frequency is controlled to be the same frequency as an input reference frequency. VCO control is accomplished in the conventional manner by comparing the oscillator's frequency with the reference frequency and then adjusting the control voltage to the input of the oscillator appropriately. The oscillator comprises a plurality of delay stages each separated by a pass transistor operable by the control voltage. This same control voltage is employed to operate the delay line comprising a plurality of identical delay stages separated by pass transistors operable by the control voltage. The delay line can be accurately used to mask out signal transitions not representative of data in the incoming data packet.

The timing for masking is accurate because the delay line is composed of circuit elements identical in geometry and orientation to those circuit elements comprising the voltage control oscillator. Because these elements are on the same semiconductor chip, the same element geometry and orientation is present and, therefore, similar circuit behavior and delay per inverter stage in the delay line controlled by the control voltage from the oscillator can be expected, thereby providing a continuously calibrated sampling window to accurately track and detect data transitions in an incoming data packet.

Other objects and attainments together with a fuller understanding of the invention will become apparent and appreciated by referring to the following descrip-

BRIEF DESCRIPTION OF THE DRAWINGS

FIG. 4 is a conventional non-overlapping clock generator.

FIG. 6 is a conventional four bit ring counter to provide a divide by four frequency output.

DETAIL OF THE PREFERRED MODE FOR CARRYING OUT THE INVENTION

Figure 1:
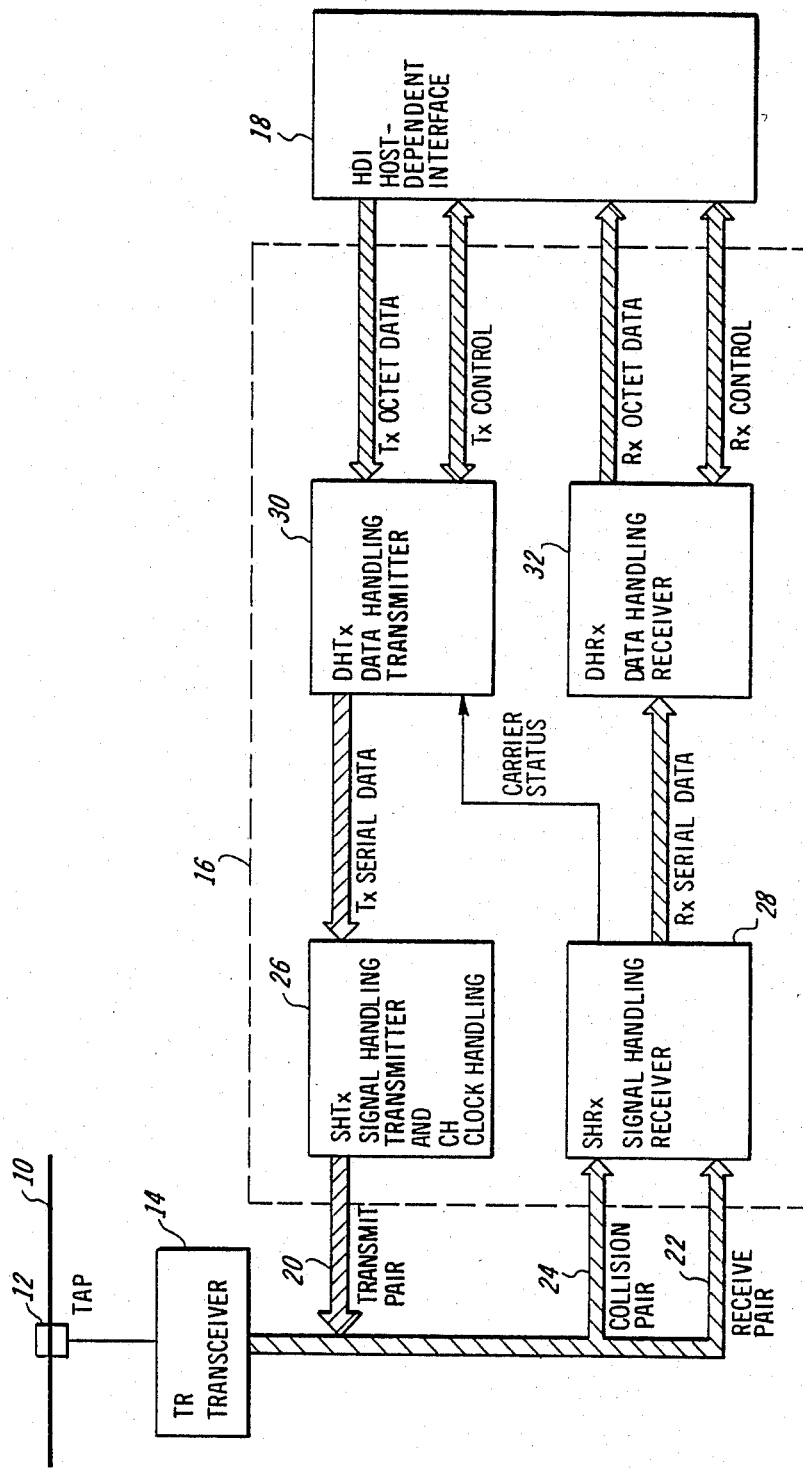
FIG. 1 is an overview of the integrated functional units comprising an Ethernet data communication controller.

As previously indicated, an Ethernet local computer network is a bus-oriented communication system providing a predefined bandwidth, e.g., 10 megabits per second. The network comprises a plurality of communicating hosts which are intelligent terminals, such as a computer workstation or processor, file server, printer server, etc., which are coupled to a communication medium, e.g., coaxial cable 10 in FIG. 1. Each host is coupled to the cable 10 by means of a cable tap 12 connected to a transceiver 14 which is coupled to an Ethernet controller 16, which, in turn, is coupled to a host dependent interface (HDI) 18 for communication and handshaking with the intelligent terminal or host. The function of transceiver 14 is to receive or transmit encoded digital data via medium 10. Transceiver 12 is also capable of detecting the presence or absence of carrier on medium 10 as well as detect whether a collision has occurred on the medium due to more than one host trying to transmit at the same time or the presence of other communication interference. If medium 10 is quiescent, transceiver 14 will be allowed to transmit phase encoded data packets. If interference is detected by the transceiver, transmission will be interrupted under CSMA/CD protocol, as set forth in the Ethernet published specifications, supra.

The transceiver 14 is connected to the controller 16 by means of three twisted pairs of lines, one pair for data transmit at 20, one pair for data receive at 22 and one pair for collision detect at 24. Controller 10 is a single nMOS chip that implements the physical layer and low-level data link layer functions of the Ethernet protocols set forth in the Ethernet published specifications, supra. Controller 16 interfaces to the transceiver twisted pair lines, encodes and transmits and receives and decodes data packets having differential ECL logic levels and provides a byte-wide (8 bits equal one byte) or octet data path to the host dependent interface 18. The term ECL is a conventional form of logic comprising differential signals vis-a-vis TTL implemented logic and has the advantage of being quite fast. The ECL Ethernet standard is a differential signal, one signal being 0.7 volts higher than the other signifying a logic high or "1" in one case and a low or "0" in the opposite case. In this way current flow for signal propagation is through the twisted pair as opposed to some other separate ground line and this isolation reduces distributed noise on transmission whereby the transmitted signal is received in better edge resolution condition as compared to using standard TTL logic levels for transmission, e.g., zero to 5 volts.

The nMOS controller 16 comprises four integrated subsystems. The signal handling transmitter (SHTx) 26 drives the transceiver transmit pair 20 with differential ECL logic levels after encoding the data onto the desired format, which in the case of Ethernet is the Manchester encoding scheme. In this encoding scheme, the typical bit stream comprises a series of bit cells with a signal transition, either positive going or negative going depending on the bit to be encoded, in the center of each bit cell. During the first half of the bit cell time, the serial signal transmitted is the logical complement of the bit value to be encoded for that cell. During the second half of the bit cell time, the uncomplemented value of the bit to be encoded is provided. In Ethernet protocol, the bit cell length is 100 ns. The signal handling transmit 26 also includes a clock handling section which provides for clock signals for use in controller 16.

The signal handling receiver (SHRx) 28 translates differential ECL input signals into clocked nMOS signals by recovering the serial data from Manchester encoded waveforms received on twisted pair 22 from transceiver 14.

The data handling transmitter (DHTx) 30, takes as input, a byte stream of octet data from host dependent interface 18 and provides signal handling transmit 26 with serialized data encapsulated in a packet preamble and a generated cyclic redundancy check (CRC) sum providing for functions, such as interpacket spacing and exponential backoff on collision detection.

The data handling receiver (DHRx) 32 reformats the serial data decoded by the signal handling receiver 28 and presents a byte stream of octet data to the host dependent interface 18 stripping off the data packet preamble and checking for the cyclic redundancy check (CRC) sum and packet alignment, which is standard Ethernet protocol.

While the implementation of controller 16 in nMOS is new and some of the attributes to accomplish such an implementation are new, the standards of operation and functioning of these four components, 26, 28, 30 and 32 are not within the scope of the present invention, and accordingly is not described in further detail. These aspects as well as a general discussion of the protocol for organizing the content of data packets for their transmission may be found in U.S. Pat. Nos. 4,063,220 and 4,282,512 and the Ethernet published specifications, supra. The present invention is related to the data and clock recovery system employed in the signal handling receiver (SHRx) 28 which has been implemented in nMOS technology.

Figure 2:
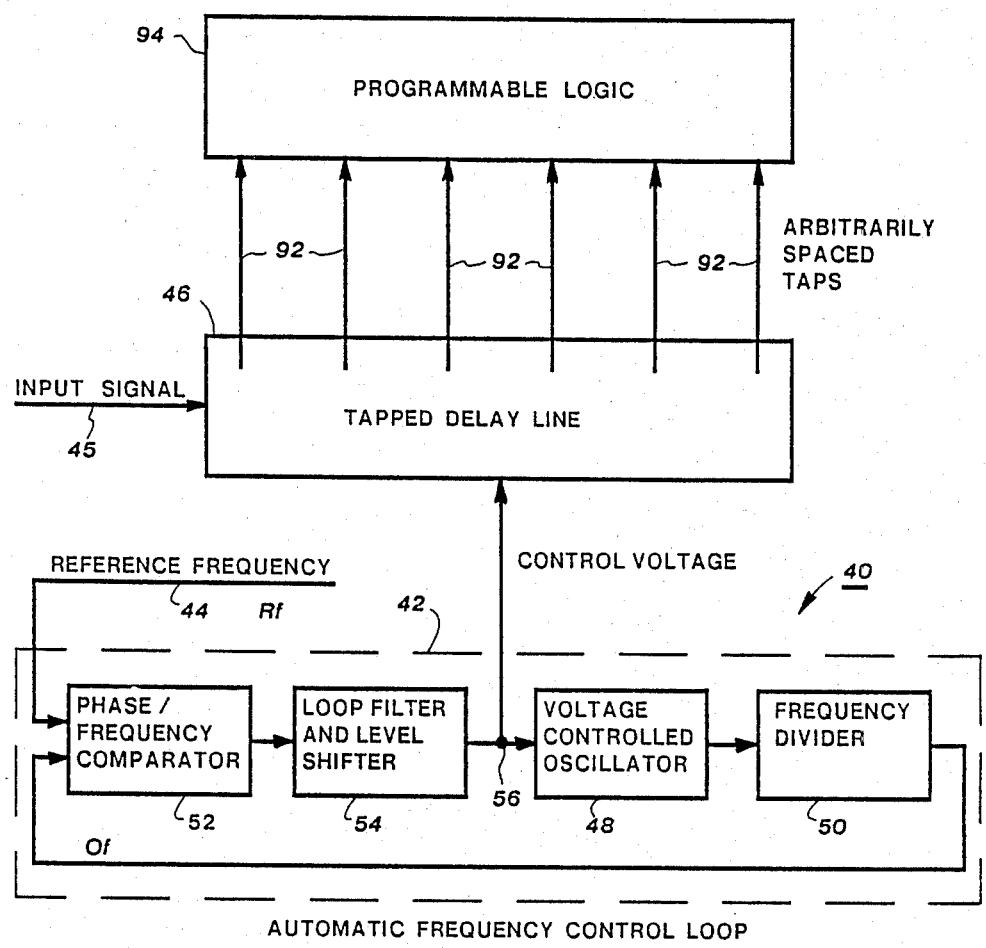
FIG. 2 is a circuit overview of a tapped delay line self-calibrated by an automatic frequency control loop.

Referring to FIG. 2, the data and clock recovery system 40 of this invention comprises an automatic frequency control (AFC) loop 42 having an input 44 for a reference frequency, $R_f$. The loop 42 runs a voltage controlled oscillator (VCO) 48 at the reference frequency or some multiple of the reference frequency in a conventional manner wherein the output frequency, $O_f$, of the VCO 48 is compared with a reference frequency, $R_f$, to produce a control voltage, $V_c$. $V_c$ is then applied to the VCO to adjust its frequency to be the same as $R_f$. The derived control voltage, $V_c$, is also employed to control the operation of a multistage means in the form of delay line 46 to provide a preselectable signal delay to an input signal supplied at input 45. The advantage obtained is that since the components comprising the delay line 46 are substantially the same as the components comprising the VCO 48, the unit delay provided by delay line 46 is known, since the unit delay of the VCO is readily determinable from the operation of the AFC loop 42. As a result, preselected partitioning of an input signal can be easily achieved for on-chip data and clock recovery.

Previously known data and clock recovery systems for data communication controllers provided no means for self-calibration to ensure continuously accurate signal sampling. Such known systems have been discrete or nonadjustable and dependent on analog circuit properties, necessitating lower performance, conservative designs or a higher risk of error or malfunction. Since the data and clock recovery system of the current invention is calibrated and adjusted by an externally provided reference frequency, it can generate preselectable signal resolution which is both accurately known, precisely adjustable and continuously dependable, thereby allowing for optimization of data and clock recovery.

Referring again to FIG. 2, the output of VCO 48 is divided by some divisor or factor via frequency divider 50. The output of divider 50, termed $O_f$, is compared with the reference frequency, $R_f$ by phase/frequency comparator 52. The output of comparator 52 is connected to the loop filter and level shifter 54 which provides an output control voltage, $V_c$ on line 56. $V_c$ varies according to pulse signals provided by comparator 52 which are indicative of the amount of difference in phase between $R_f$ and $O_f$. Line 56 is coupled to both the tapped delay line 46 and the VCO 48 and controls the unit delay developed by these two multistage devices.

Figure 3:
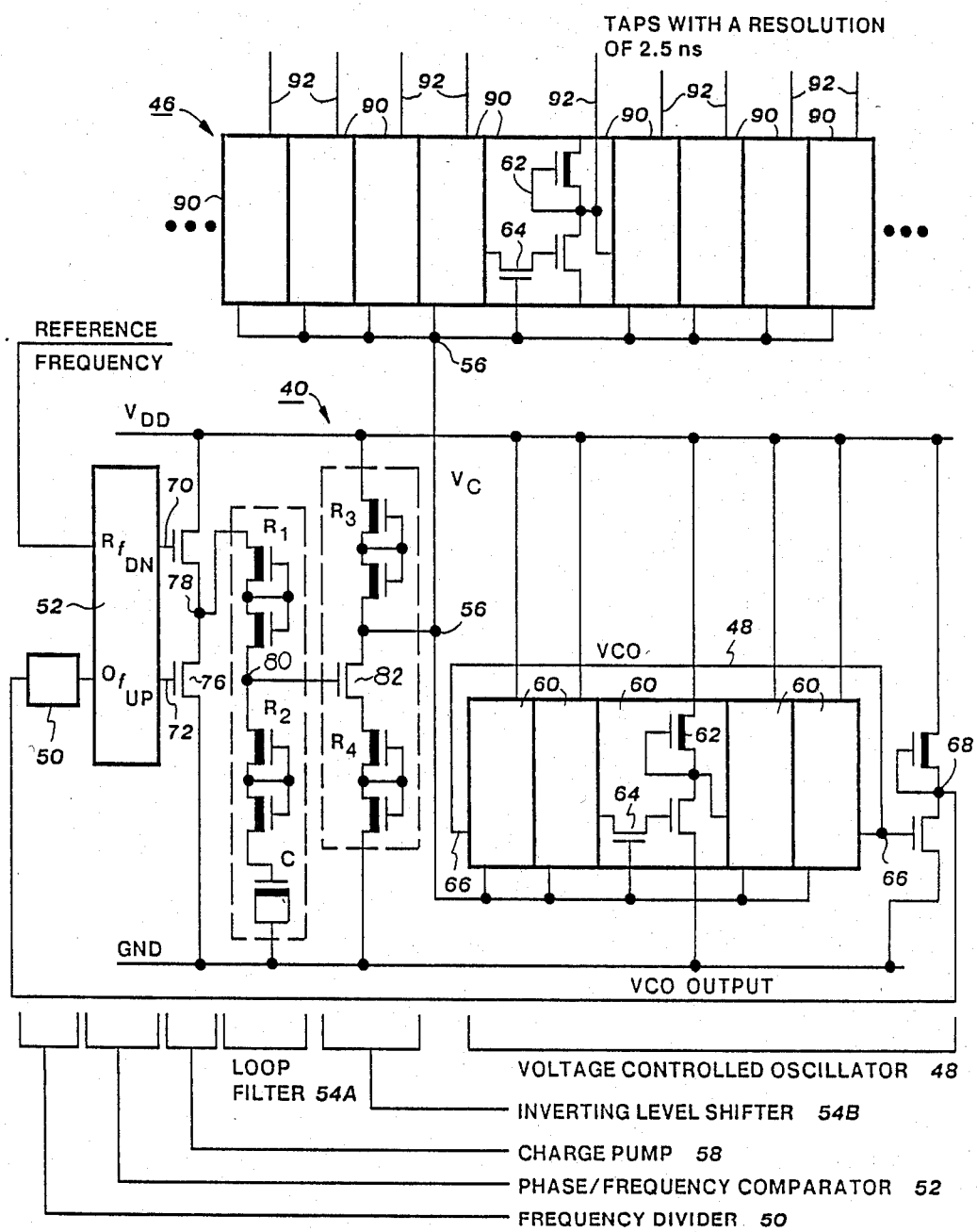
FIG. 3 is a more detailed disclosure of the circuitry for the tapped delay line and automatic frequency control loop of FIG. 1.

Reference is now made to FIG. 3 which details further features of the system 40 of FIG. 2. Aspects of the system not detailed in FIG. 3 are detailed in FIGS. 4–8.

The stages of VCO 48 comprise a series of voltage controlled delay stages 60. Stages 60 number five in the embodiment shown. Basically, each stage 60 comprises an inverter 62 preceded by a pass transistor 64. Each of the stages 60 is connected to $V_{DD}$ and ground (GND), as illustrated in detail in FIG. 3 for the central stage of VCO 48. The output 66 of VCO 48 is connected to inverter 68 which acts as a buffer and isolates the VCO from possible outside loads and ensures that the VCO sees a limited load impedance. Output 66 is also connected to the pass transistor of the first stage of VCO 48 thereby providing continuous ring oscillator operation while eliminating the need for any circuit initializing. The output of inverter 68 is the input to frequency divider 20. The inversion of the VCO output 66 by inverter 68 is immaterial since it is only the frequency of this signal that is to be examined at comparator 52.

VCO 48 is operative upon application of the control voltage, $V_c$, via line 56 to each of the pass transistors 64 of its stages 60. The pass transistors 64 act as variable resistance controlled by $V_c$. Varying $V_c$ changes the resistance of transistors 64 so that the RC delay through each stage 60 will correspondingly change. $V_c$ is an analog voltage and basically causes the resistance of transistors 64 to become larger or smaller as $V_c$ respectively goes lower or higher causing the frequency of VCO 48 to respectively decrease or increase to be the same as or a multiple of $R_f$.

The period of the output, i.e., one cycle, of VCO 48 is twice the delay through all the stages 60 because for half the period, all the stages are high and for the other half of the period all the stages are low. The delay per stage ($T_o$) is derived as follows:

$$T_o = 1/(R_f \times D \times 2 \times S),$$

where $R_f$ is the reference frequency, D is the divisor or division factor of frequency divider 50 and S is the number of stages in the VCO. As an example, if $R_f$ is equal to 10 MHz, D is equal to four and S is equal to five stages (as shown), the delay per stage is equal to 2.5 ns.

The function of frequency divider 50 is to divide down the frequency $O_f$ to that of frequency $R_f$ for comparison. The division factor may be any integer starting with one. For example, with a division factor of four, a reference frequency of 10 MHz and a VCO of five stages, the VCO frequency would be 40 MHz.

As previously indicated, phase/frequency comparator 52 compares $R_f$ with $O_f$ and may generate one of two possible pulse signals, termed UP and DOWN, if $R_f$ and $O_f$ are not in phase with each other. For example, if the leading edge of a pulse for $O_f$ arrives at the input of comparator 52 prior to the arrival of the leading edge of a pulse for $R_f$, comparator 52 will initiate the generation of a DOWN pulse. When the leading edge of a pulse for $R_f$ does arrive, the generation of the DOWN pulse will be terminated. Likewise, if the leading edge of a pulse for $R_f$ arrives before the leading edge of a pulse for $O_f$, an UP pulse will be generated for the period of phase difference between the arrival of these pulses.

The UP and DOWN pulses are provided as outputs 70 and 72 to charge pump 58 comprising a pair of enhancement transistors 74 and 76 connected between $V_{DD}$ and GND. DOWN pulse output 70 is connected to the base of transistor 74 while UP pulse output 72 is connected to the base of transistor 76. A pulse to the base of transistor 44 acts to switch $V_{DD}$ to the input 78 of loop filter 54A. A pulse to the base of transistor 76 acts to switch the input 78 of loop filter 54A to GND.

Loop filter 54A is a second order loop filter to provide an AFC loop of small bandwidth and a low damping factor. Loop filter 54A comprises the RC network, $R_1$ and C, connected between input 78 and ground, with damping resistor $R_2$ connected between $R_1$ and C. The output 80 of loop filter 54A is connected as the input to inverting level shifter 54B. The values for $R_1$ and C for loop 54A are determined so that the RC time constant is fairly large and the bandwidth is low so that the loop will not react dramatically to changes occurring at its input 78.

The resistor $R_2$ is fairly small in value compared to $R_1$ and provides some damping and stability in the operation of the loop. The output 80 between R₁ and R₂ is basically a voltage divider with R₂ insuring small or very little ripple on the output signal to shifter 54B. Alternatively, there can be enough inherent resistance in the diffusion region of the large capacitor C to insure that the loop is stable. Ripple present in output 80 is of no real consequence because when the loop locks onto a voltage value, the UP and DOWN pulses will be so narrow that the ripple will be fairly filtered by the loop circuitry.

Examples for the values of the components of loop 54A are R₁ about 200 KΩ, R₂ about 40 KΩ and C about 100 pF.

The purpose of inverting level shifter 54B is to adjust for the desired range of voltages acceptable for operating VCO 48, i.e., to shift the voltage level present on line 80 to a voltage level acceptable for operation as a control voltage to the stage inputs of VCO 48. Since the enhancement transistor 74 has some voltage drop, which is dependent on its body effect and current threshold, a voltage equal to $V_{DD}$ cannot be possibly stored on capacitor C. However, the range of frequency operation of the VCO is such that it will operate at a maximum frequency when $V_c$ is equal to $V_{DD}$. Thus, shifter 54B acts as a voltage level translator to satisfy the operational input needs of VCO 48.

Shifter 54B comprises an input enhancement transistor 82 connected between two resistors R₃ and R₄ which are respectively connected to $V_{DD}$ and GND, as shown in FIG. 3. When pass transistor 82 is placed in a conductive state with a sufficient voltage at its base, R₃ and R₄ will function as a voltage divider so that some voltage value between GND and $V_{DD}$ will appear on output line 56. If the output of filter 54A is at zero or ground, transistor 82 will not be in a conducting state. Since R₃ is a depletion device and transistor 82 is off, $V_{DD}$ will be directly coupled as an output to line 56. From this explanation, it can be seen that the highest voltage boundary for the voltage operating range at loop output 80 from filter 54A becomes the lowest voltage boundary for the voltage operating range of $V_c$ on line 56 while the lowest voltage boundary for the voltage operating range at loop output 80 from filter 54A becomes the highest voltage boundary for the voltage operating range of $V_c$ on line 56. Intermediate voltages for $V_c$ between these $V_c$ boundaries have an approximate linear relation to the intermediate voltages between the voltage boundaries possible at loop output 80 as applied at the input of shifter 54B.

From the foregoing description, it can be seen that the AFC loop 42 provides for a control voltage, $V_c$, that is adjusted continuously so that the output frequency $O_f$ of VCO 48 is at the same phase as the reference frequency $R_f$. Thus, the delay per stage of the VCO 48 will be constantly calibrated to the same predeterminable value according to the previous definition for $T_o$.

Reference is now made to the construction of the tapped delay line 46. Delay line 46 comprises a plurality of delay stages 90 identical to stages 60 of VCO 48. Thus, pass transistor 64 and inverter 62 carry the same numerical identifier. As implemented in MOS/VLSI technology, e.g., nMOS, the components comprising stages 60 and 90 have the same orientation so that mask misalignments occurring during fabrication will have an identical effect and, consequently, their physical properties and attributes. Also, it is preferred, although not absolutely necessary, that these stage components be fabricated in close proximity on a wafer or chip to ensure no large variation across the chip. Further, it is preferred, although not absolutely necessary in all cases, that there be some similarity as to the impedance load present on these two stage component devices. Impedance matching can be easily implemented by providing additional capacitance at points along the stage component to be matched, which capacitance may, for example, be supplied in the form of a shunt depletion transistor acting as a capacitive load.

From the foregoing description, it is clear that each stage 90 of the delay line 46 will have a delay substantially equal to each stage 60 of VCO 48. By providing the appropriate taps 92 at all or selected stages 90 of delay line 46, a delayed version of an input signal 45 may be provided to have a predetermined waveform of preselected edge resolution because the delay per stage is a known value and the point of edge resolution (signal transition) may be determined by the preselection of designated taps 92. The taps 92 are selected for application to appropriate programmable logic circuitry 94 to perform the desired logic functions to recover the transmitted packet data, termed DATA (NRZ), to provide an indication that as to what is being received is or is not valid data, termed DATA VALID, and recover the data clock, termed DATA CLOCK. Details concerning this recovery will be explained later. Reference is now briefly made to FIGS. 4–8. The circuitry shown in these figures is conventional but is disclosed and briefly discussed to complete the detail of the circuitry for the AFC loop 42.

Figure 4:
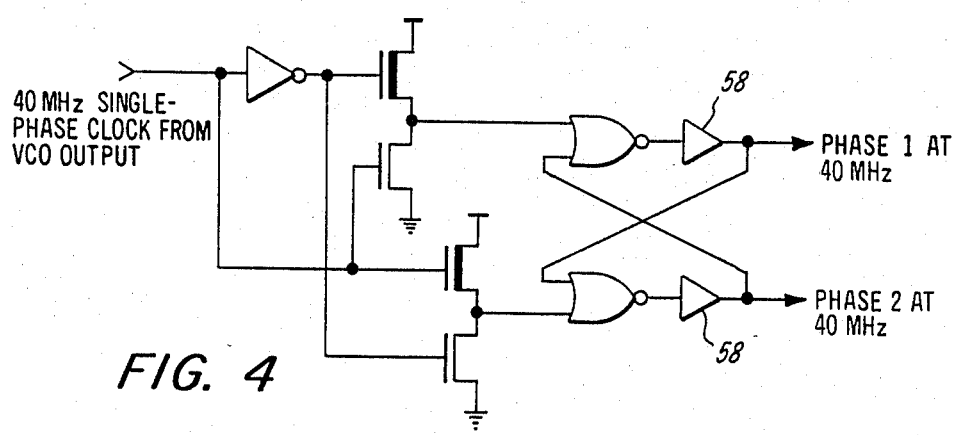
FIGS. 4 and 6 are detailed circuit implementation for the frequency divider circuit shown in FIG. 3.
Figure 5:
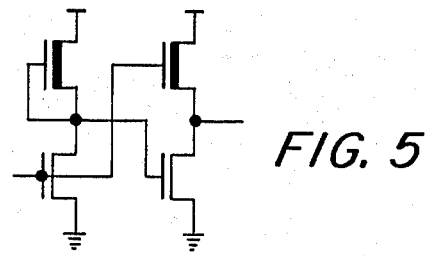
FIG. 5 is a detailed circuit implementation of the super buffers in FIG. 4.
Figure 6:
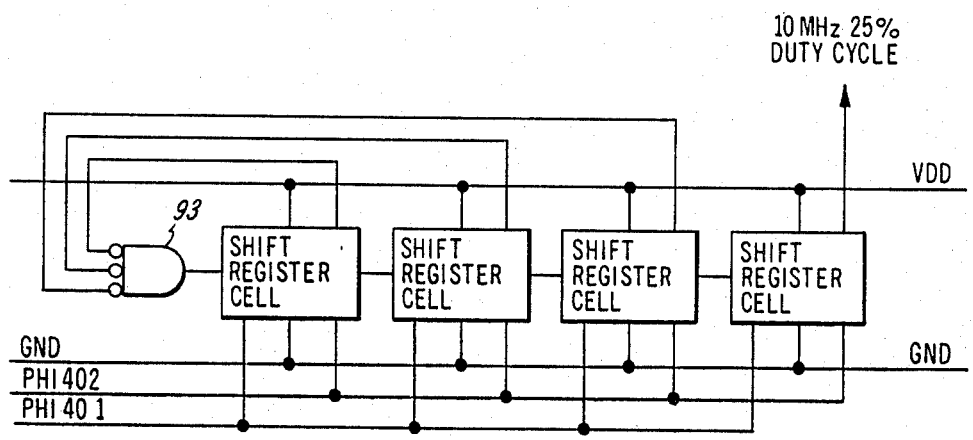

FIGS. 4 and 6 disclose logic circuitry comprising the frequency divider 50. In FIG. 4, the circuit shown is a conventional clock generator (see page 229 of "Introduction to VLSI Systems", supra) that takes the single phase clock input from VCO 48 and produces two nonoverlapping phases of that clock. FIG. 5 shows the details for the superbuffers SB in FIG. 4 comprising cross-coupled inverters to ensure nonoverlap and are detailed at pages 17 and 18 in "Introduction to VLSI Systems", supra.

Figure 7:
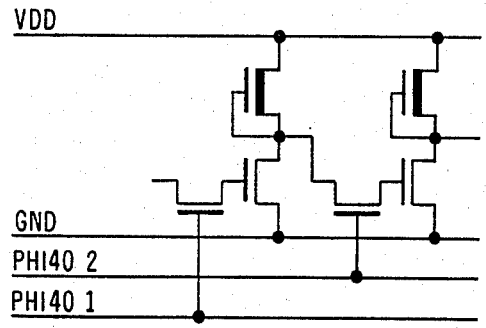
FIG. 7 is a detailed circuit implementation of the shift register cells in FIG. 8.

The clock phases are then supplied as inputs to four series connected shift register cells, which with input gate 93, provide a conventional four bit ring counter shown in FIG. 6. The outputs of all but the last of the shift register cells are NORed together by gate 93 to provide an input to the first shift register cell of the counter thereby completing the ring counter. There are as many stages or cells as the division factor that is necessary. Therefore, there are four cells and in the case where the VCO output is equal to 40 MHz, the output, $O_f$, at the last cell is 10 MHz at 25% duty cycle and is the input to comparator 52. FIG. 7 shows the details for each of the shift register cells in FIG. 6 which are conventional and are detailed at page 67 of "Introduction to VLSI Systems", supra.

Figure 8:
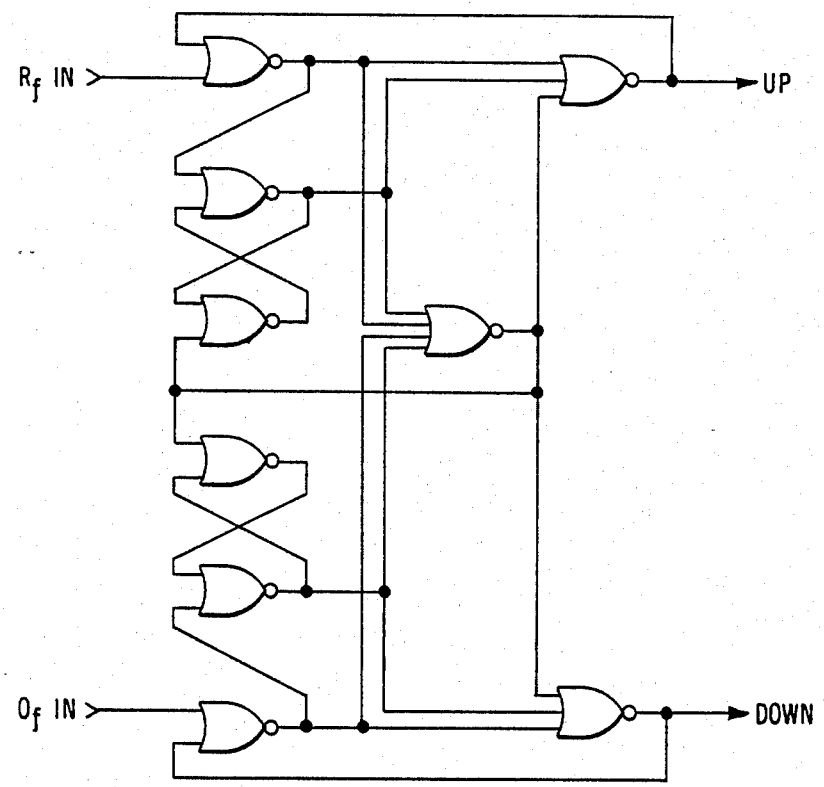
FIG. 8 is a logic diagram implementation for the phase/frequency comparator shown in FIG. 3.

FIG. 8 shows the circuit detail for the phase/frequency comparator 52 which is a conventional circuit comprising a series of NOR gates with mirror cross-coupled NOR gates and output NOR gates. Comparator 52 is similar to a MC4300/MC4000 series phase/frequency chip obtainable from Motorola Corporation. The circuit operates strictly on transitional edges of an incoming signal $R_f$ or $O_f$. The pulse width produced at outputs 70 or 72 are proportional to how far apart the transitional edges of the two input pulses from signals $O_r$ and $O_f$ may be at any given time.

Figure 9:
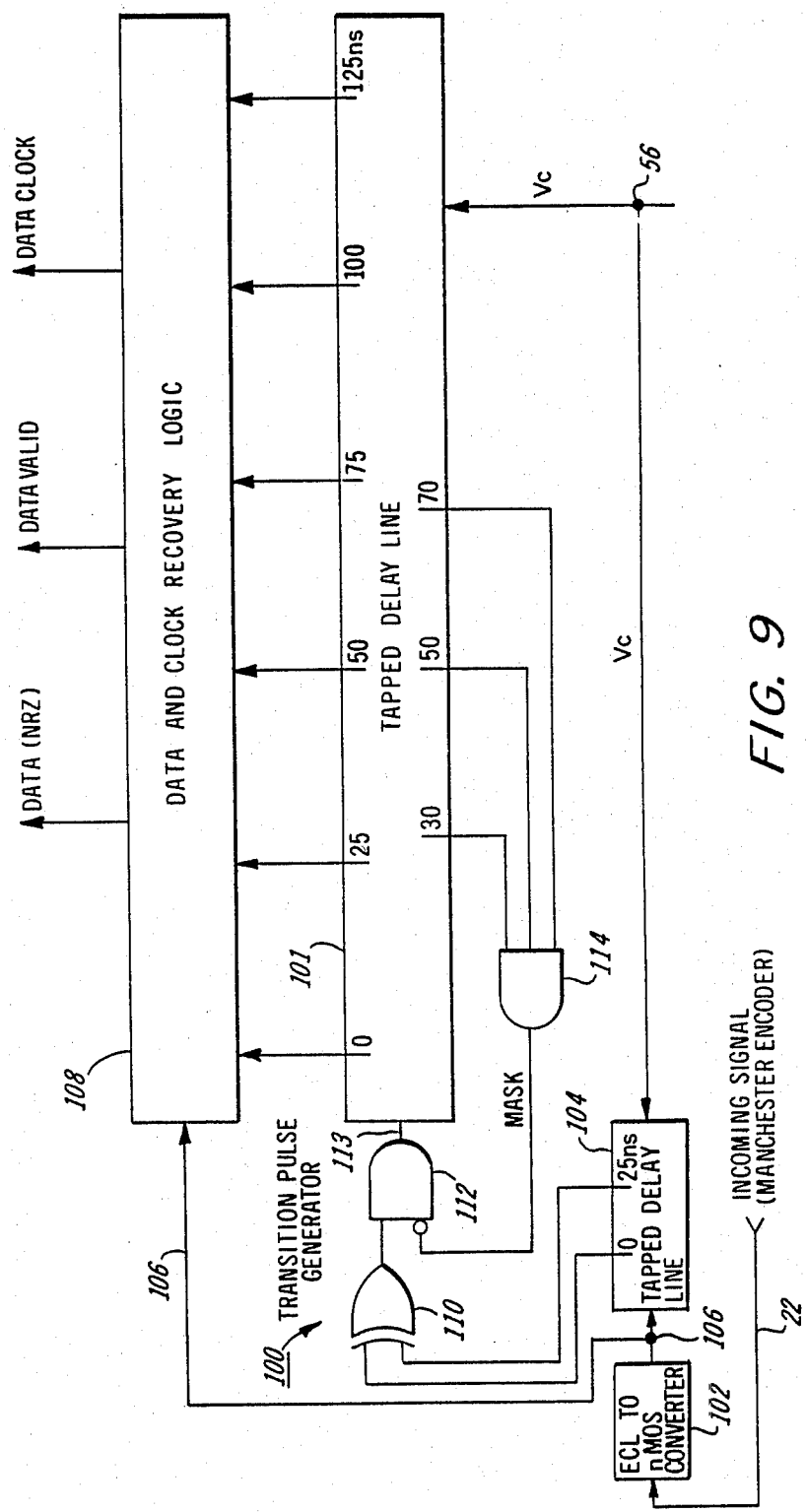
FIG. 9 is a circuit diagram detailing the employment of the tapped delay line in the receiver of the Ethernet controller.

FIG. 9 discloses the detail of the implementation of a data and clock recovery system 100 for Manchester encoded data. Delay line 101 comprises a plurality of delay stages, like stages 90, with taps at 0, 25, 30, 50, 70, 75 and 125 ns. Each stage is designed to provide a unit delay or delay per stage, in the case here being 2.5 ns per stage. Thus, tap line 101 has 50 stages.

ECL to nMOS converter 102 receives the incoming Manchester encoded data packet and translates the differential ECL level signals into nMOS levels of 0 and 5 volts. The output from converter 102, termed DATA, is the converted Manchester encoded signal which is supplied to the input of small ten stage tapped delay line 104 via line 106. Line 106 is also connected as the input to the data and clock recovery logic 108. Details relative to both converter 102 and logic 108, will be discussed later in connection with FIGS. 11-14.

Control voltage, $V_c$, on line 56 is supplied to each of the stages of both both lines 100 and 104. Although this is represented only as a single line 56 in FIG. 9, it should be understood that connection to both of these delay lines is the same as that shown for stages 90 in FIG. 3. The connection lines have been eliminated from FIG. 9 for purposes of clarity.

The output of delay line 104 provides a 25 ns delay to every signal transition present in the incoming signal on line 106. This output is supplied to the exclusive OR gate 110 which is connected to the noninverting input of AND gate 112. The other or inverting input to AND gate 112 comprises the mask input from AND gate 114. AND gate 114 is provided with three inputs which are from the 30 ns, 50 ns and 70 ns taps of delay line 101. The output of AND gate 112 is connected on input line 113 to the pass transistor of the first delay stage of delay line 101.

Figure 10:
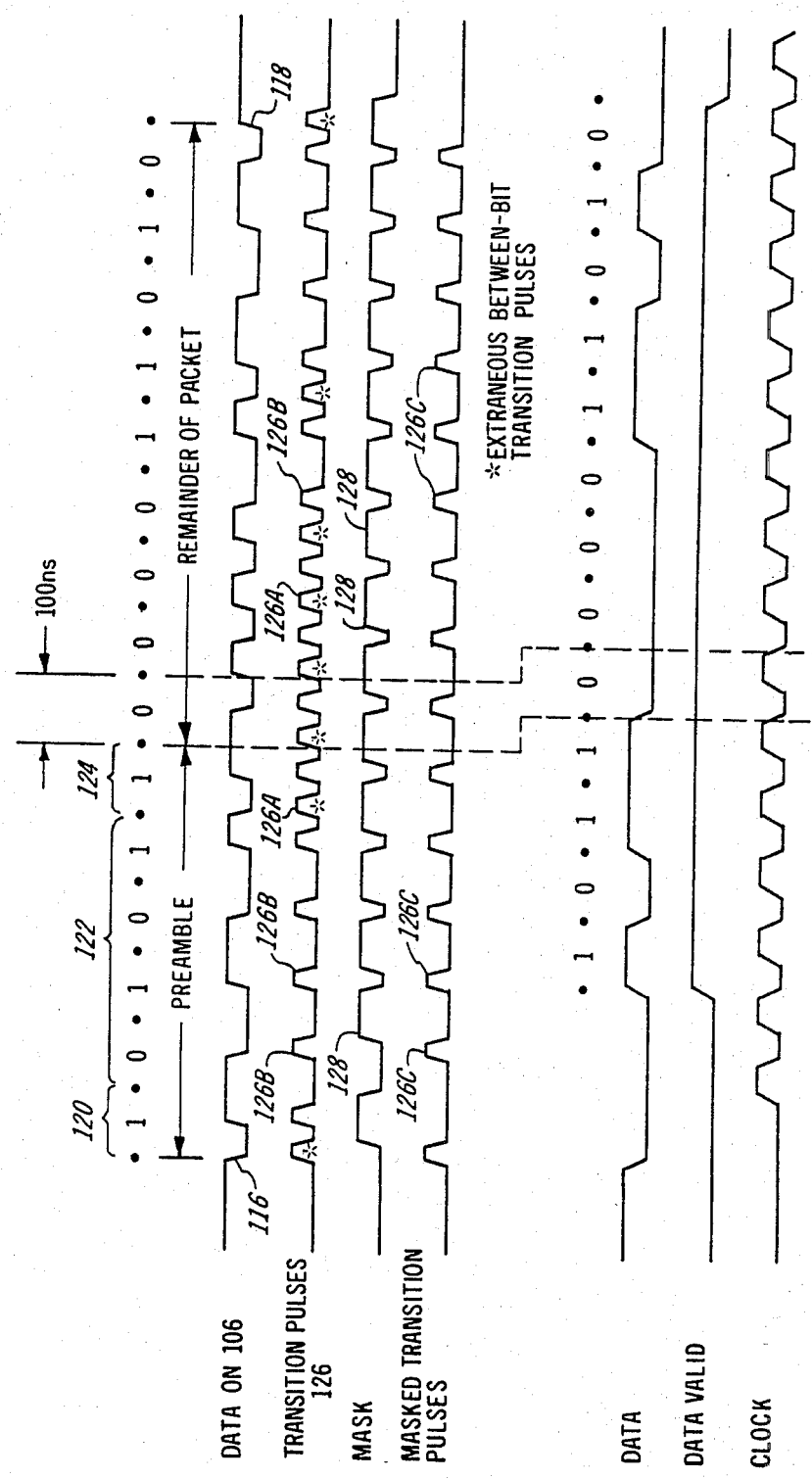
FIG. 10 is a waveform diagram illustrating the operation of the circuitry shown in FIG. 9.

The clocking convention used in this embodiment is based upon delayed pulses arriving from delay line 104. The pulses from line 104 are termed TRANSITION PULSES and are of 25 ns duration. An example of these pulses is illustrated in FIG. 10 at the waveform for TRANSITION PULSES. These pulses are, in turn, delayed through delay line 101 in the designated amounts indicated along the line. The mask to be provided is between 30 ns to 95 ns (70 ns plus the previous 25 ns duration provided by delay line 104). For each 100 ns bit cell, a mask will be generated between 30 ns to 95 ns after its bit transition. The mask places an inhibition on input AND gate 112 so that no further pulse transitions will enter delay line 100 until the mask is disenabled. The mask, therefore, is being created in a manner to mask out between bit transitions, that is, those transition pulses that do not represent data in the data packet but are only set up transitions for Manchester encoded data. Thus, 25 ns wide transition pulses are employed in delay line 101 to sample the signal at appropriate times, to provide masking out of between bit transitions and also supply a receive clock that will be synchronized to the decoded Manchester data. The recovered data and clock are then sent on to the data handling receiver (DHRx) for further processing.

The waveforms disclosed in FIG. 10 are now referenced to explain the operation of the delay lines 101 and 104 and the masking of the between bit transition pulses. The first waveform, INPUT SIGNAL, represents a typical input signal, DATA, comprising a data packet that includes a preamble and a packet remainder that is the binary data and other information such as address and location. For the purpose of this explanation, reference is made only to packet remainder being comprised of data.

The preamble of the packet is important, as it gives a clear indication of bit cell boundaries of the packet. The first transition 116 of a data packet is always a negative going transition while an end of packet transition 118 is always a positive going transition. The preamble consists of a predetermined number of bit cells, the first one being the "set up" cell 120 with transition 116 and the remaining bit cells being alternating so that there is no Manchester between bit transition. This alternating preamble data sequence is represented by the bit cell group 122. Bit cell 124, being a logic "1" and the same as the previous cell, gives an indication of the end of the preamble and that the remaining portion of the packet is data, i.e., data transitions with between bit transitions.

As previously indicated, the waveform for TRANSITION PULSES represents the output from the exclusive OR gate 110. All transitions in the signal are converted to 25 ns long pulses 126. Some of those pulses 126A represent between bit transitions, as identifiable from the DATA signal and are marked in FIG. 10 with a dot. The remaining pulses 126B represent real data except in the preamble relative to alternating bit cell group 122.

The waveform for MASK represents the output of AND gate 114. Upon the occurrence of each transition pulse 126, a mask pulse 128 is generated for 65 ns. Because of the delay applied to all transition pulses, these pulses represent, in time, a precise time frame around the between bit transitions, which 20 ns before the end of a bit cell and 45 ns into next adjacent bit cell.

The waveform for MASKED TRANSITION PULSES 126C are designated TRANSITION PULSES 126 and represents the input 113 to delay line 101. MASKED TRANSITION PULSES 126C represent only the points of transitions for sampling data transition pulses in the Manchester encoded data stream coming into data and clock recovery logic 108.

There are three other waveforms DATA (NRZ), DATA VALID & CLOCK in FIG. 10 and these are representative of the three outputs provided by data and clock recovery logic 108, which will be touched upon later.

Figure 11:
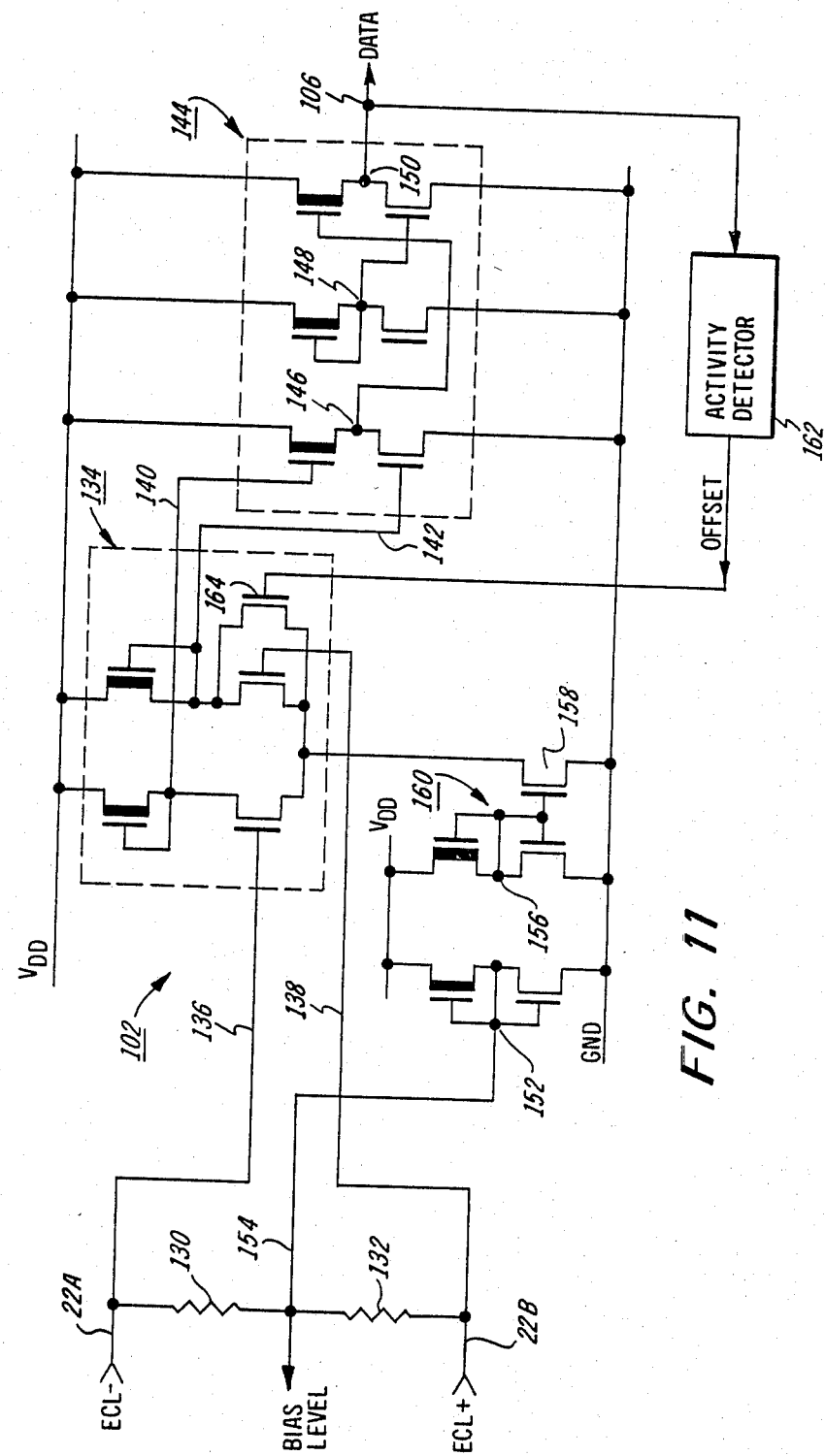
FIG. 11 is a detail circuit diagram for the ECL to nMOS driver shown in FIG. 9.

FIG. 11 shows a detail implementation for the ECL to nMOS converter 102. The incoming Manchester encoded signals are at differential ECL levels and are translated to nMOS levels for acceptable use by the data and logic recovery system 100. The conventional ending of the twisted receive pair 22, comprising lines 22A and 22B from the transceiver 14, are the two terminating resistors 130 and 132 connected together at one end to line 154 and connected respectively at their other ends to lines 22A and 22B. These resistors match the impedance of the pair to prevent signal reflections. In accordance with Ethernet published specifications, supra, these resistors each have a value of 39$\Omega$. The ECL minus and ECL plus signals 22A and 22B drive differential amplifier 134 via inputs 136 and 138. Since one side of the ECL signal is always more positive than the other, the two inputs 136 and 138 of the differential amplifier 134 correspondingly drive the amplifier to provide an output respectively at its output lines 140 and 142 to the supper buffer 144. The first inverter stage of buffer 144 puts the compliment of the signal inputs 140 and 142 onto inverter 146 which provides output for the two super buffer stages 148 and 150. The output of buffer 144 is an nMOS converted signal, DATA, on line 106.

The inverter 152 is an inverter tied to its own input and generates a voltage bias level applied via line 154 between terminal resistors 130 and 132.

The inverter 156 and pass transistor 158 represent a current source 160 for differential amplifier 134.

The bias circuit 152 and current source 160 provide for the proper functioning of differential amplifier 134. The voltage bias circuit 152 ensures that the bias point between the resistors 130 and 132 is high enough to operate the input enhancement transistors of the amplifier 134 and the current source ensures that the voltage drop across the amplifier transistors is sufficient to ensure a high level signal on output lines 140 and 142 to buffer 144.

The output DATA on line 106 of converter 102 is also supplied to activity detector 162 which is a logic circuit that provides a voltage output OFFSET to enhancement transistor 164. Transistor 164 is connected in parallel to the amplifier input enhancement transistor having its base connected to line 138. The function of OFFSET when high or applied is to ensure that when there is no signal on the twisted pair 22A and 22B, the amplifier 134 is pulled into and held to one state. When no signal is present on the pair 22, the tendency for the voltage difference present on ECL lines 22A and 22B is to drift toward each other since these lines are floating, i.e., capacitively coupled. To make sure that one side of the converted signal has a definitive set position when the twisted pair is quiescent, the voltage OFFSET is applied to amplifier 134 producing an output high or "1" on line 106. This is exemplified in FIG. 10 at input signal for DATA before transition 116 or after end of packet transition 118.

Since the first transition of a signal coming in on pair 22 will be a negative going transition 116, the output DATA of converter 102 will be low, causing detector 162 to switch the voltage OFFSET to off or zero.

It should be noted that activity detector 162 may, for example, be a self-calibrated delay line similar to delay line 104 and having a 100 ns length with voltage bias logic at the delay line output. If there has been a transition pulse through the line in the last 100 ns, the period of a bit cell, then the output at the end of the line will be, OFFSET off or zero volts. If no pulse occurs, then a voltage bias is applied to the base of transistor 164 to turn this transistor on and hold the DATA output 106 of converter 102 high.

Figure 12:
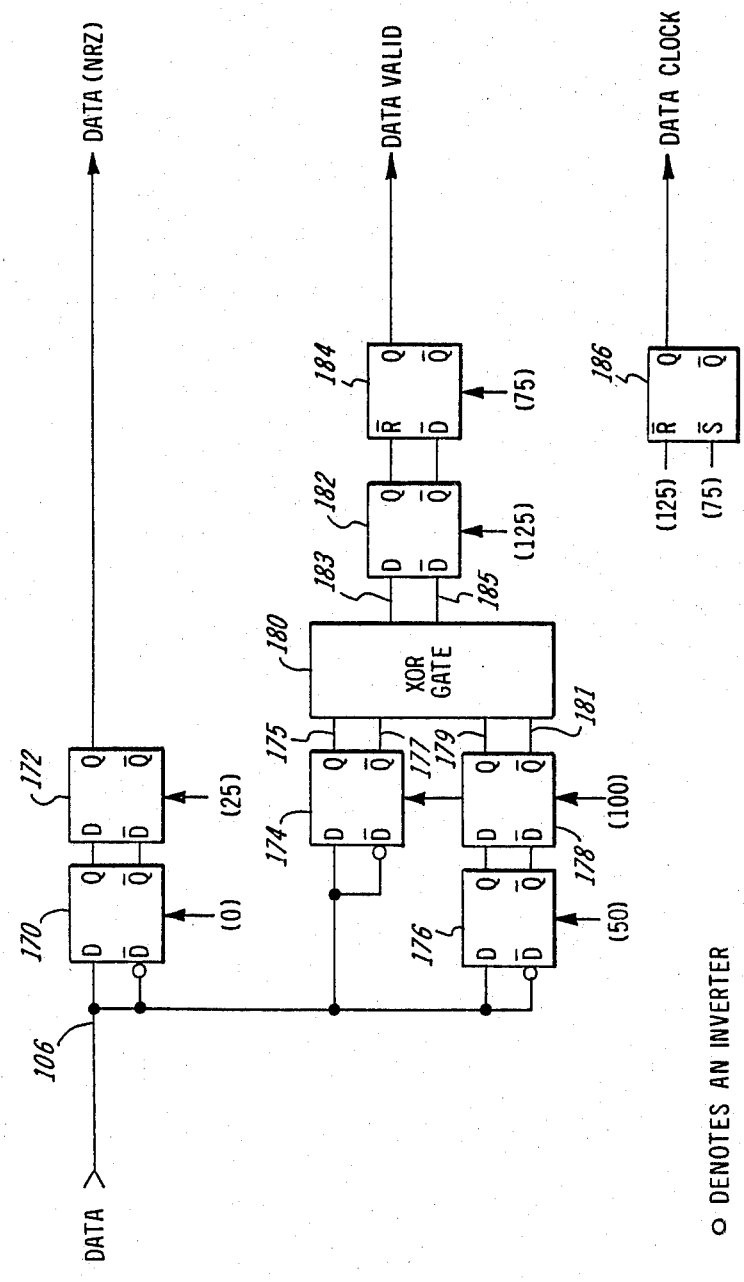
FIG. 12 is a logic diagram of the data sampler shown in FIG. 9.

Referring again to FIG. 9, the data and clock recovery logic 108 comprises conventional logic circuitry to provide (1) for recovery of the data from the input DATA in the form of a nonreturn to zero (NRZ) signal, which is DATA(NRZ), (2) for providing an indication when data is valid, i.e., when there is data present, or not valid, which is DATA VALID and (3) a receive clock recovery from the input DATA, which is CLOCK. FIG. 12 discloses an implementation for logic 108. The incoming data packet on line 106 is supplied to both the noninverting and inverting inputs of a D flip-flop 170, which has its Q and Q bar outputs connected to D and D bar inputs of another D flip-flop 172. The logic for these flip-flops is conventional and disclosed in FIG. 13C. The CLK input for flip-flop 170 is the 0 ns tap of delay line 101 (see FIG. 9). The CLK input for flip-flop 172 is the 25 ns tap of delay line 101. The D flip-flops 170 and 172 provide a DATA (NRZ) signal output based upon the signal input 106 sampled during the presence of MASKED TRANSITION PULSES 126C on tap inputs at 0 ns and 25 ns of delay line 101 such that either a high signal is generated during bit cell periods when the data bit transition is positive going transition and a low signal is generated during bit cell periods when the data bit transition is a negative going transition, as indicated by the waveform DATA (NRZ) in FIG. 10.

Figure 13A:
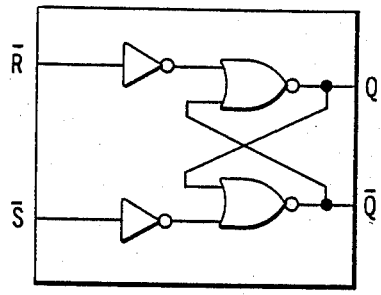
FIGS. 13A, B and C are logic diagrams of the three different types of flip-flop logic shown in FIG. 12.

Incoming signal DATA on line 106 is also supplied to both an inverting and noninverting input of D flip-flops 174 and 176. The Q and Q bar outputs of flip-flop 174 are two inputs 175 and 177 of four inputs to XOR Gate 180. The Q and Q bar outputs of flip-flop 176 are connected as inputs of corresponding D flip-flop 178. The Q and Q bar outputs of flip-flop 178 are the other two inputs 179 and 181 to XOR gate 180. The outputs 183 and 185 to XOR gate 180 are respective inputs to D flip-flop 182. The logic configuration for the D type flip-flops 174, 176, 178 and 182 is shown in FIG. 13C and is conventional. Flip-flop 176 has a CLK input from the 50 ns tap delay line 101, flip-flops 174 and 178 have a CLK input from the 100 ns tap of delay line 101 and flip-flop 182 has a CLK input from the 125 ns tap of delay line 101.

Figure 13B:
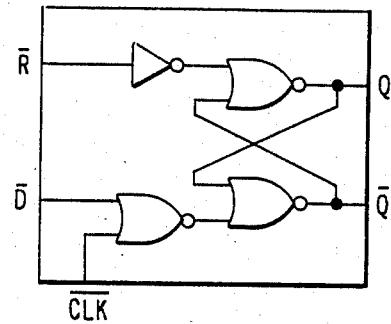
Figure 13C:
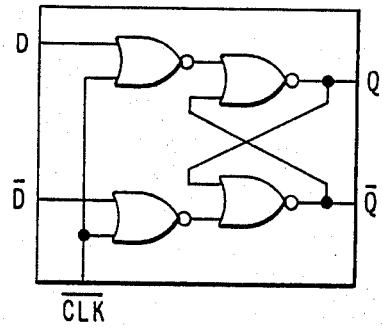
Figure 14:
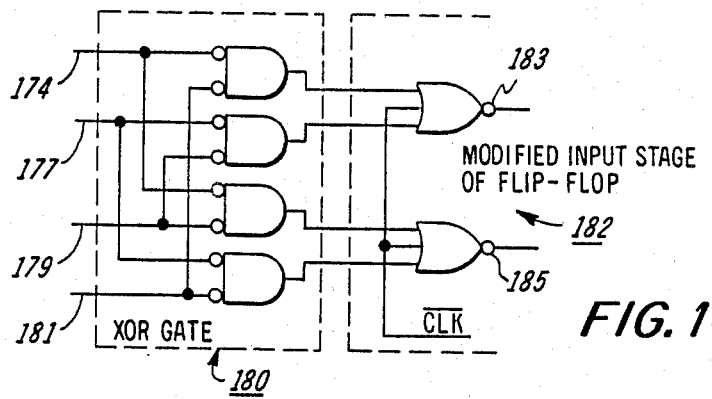
FIG. 14 is a detail circuit diagram of the exclusive OR gate shown in FIG. 12.

The Q and Q bar output of flip-flop 182 are the parallel R bar and D bar inputs to a flip-flop 184, the logic configuration of which is shown in FIG. 13B. The CLK input to flip-flop 184 is from the 75 ns tap of delay line 101. The Q output of flip-flop 184 is the signal DATA VALID, a representation of which is shown in FIG. 10 at the waveform DATA VALID. As shown, DATA VALID remains high as long as data transition pulses are present in the incoming data packet on line 106.

The received clock recovery, DATA CLOCK is provided by an R-S flip-flop 186 with inputs R bar and S bar are connected respectively to the 125 ns and 75 ns tap outputs of delay line 101. The logic configuration for this conventional R-S flip-flop is shown in FIG. 13A. A representation of this clock output for the example shown in FIG. 10 is the waveform, DATA CLOCK.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A data and clock recovery system for recovery of phase encoded data from a data packet received by a data communication controller, said data packet including a plurality of data bit cells with one portion of each bit cell representing a logical complement of the bit value encoded and the other portion of each bit cell representing the bit value encoded whereby some transitions in a stream of said data bit cells represent one of two bit values while others represent between bit transitions, said system comprising delay means including a plurality of delay stages to apply a predetermined amount of unit delay to all of said transitions to generate a transition pulse for every transition in said data packet, means to develop a mask from said transition pulses representative of the time occurrence of said between bit transitions, means to apply said mask to said data packet whereby said encoded bit values are recovered therefrom, and means to calibrate said delay means to ensure that each of said delay stages continuously impose said predetermined unit delay per stage.

2. The recovery system of claim 1 wherein said mask developing means includes a second delay means to apply a preselected amount of unit delay to all of said transition pulses.

3. The recovery system of claim 1 wherein said calibrating means includes a plurality of delay stages of identical structure to the delay stages comprising said delay means.

4. The recovery system of any one of claims 1, 2 or 3 wherein said calibrating means is an automatic frequency control loop including a voltage controlled oscillator, the control voltage developed to drive the delay stages of said oscillator also employed to drive the delay stages of said delay means.

5. The recovery system of claim 1 wherein said calibrating means is an automatic frequency control loop including voltage controlled oscillator, the control voltage developed to drive the delay stages of said oscillator also employed to drive the delay stages of said delay means.

6. The recovery system of claim 5 wherein said automatic frequency control loop comprises
   means to compare the operating frequency of said voltage controlled oscillator with a reference frequency and develop an output representative of any difference therebetween, and
   means to produce a control voltage representative of said difference to adjust the voltage controlled oscillator to be the same as that of said reference frequency whereby the adjustment made to the unit delay provided by all of said delay stages is uniform and independent of any differences in the physical and electrical characteristic that may be present in the circuitry comprising said delay and calibrating means.

7. The recovery system of claim 6 wherein said comparing means includes a frequency divider.

8. The method of obtaining precise timing in integrated circuitry to recover phase encoded data from a data packet comprising a plurality of data bit cells with one portion of each bit cell representing a logical complement of the bit value encoded and the other portion of each bit cell representing the bit value encoded whereby some transitions in a stream of said bit cells represent one of two bit values while others represent between bit transitions and comprising the steps of
   producing a predetermined amount of unit delay to all of said transitions occurring in said data packet,
   developing a mask based upon said unit delay, said mask representative of the time occurrence in said between bit transitions not representative of data,
   applying said mask to recover said phase encoded data and
   calibrating said unit delay to be continually maintained at the same predetermined amount concurrently with the carrying out of the previous two steps.

* * * * *